United States Patent

Szczyrbowski et al.

[11] Patent Number: 5,264,099
[45] Date of Patent: Nov. 23, 1993

[54] METHOD FOR PRODUCING AN OPAQUE SUBSTRATE

[75] Inventors: Joachim Szczyrbowski, Goldbach; Anton Dietrich, Triesen; Albert Kastner, Maintal; Klaus Hartig, Ronneburg, all of Fed. Rep. of Germany

[73] Assignee: Leybold Aktiengesellschaft, Fed. Rep. of Germany

[21] Appl. No.: 664,790

[22] Filed: Mar. 5, 1991

[30] Foreign Application Priority Data

Jun. 8, 1990 [DE] Fed. Rep. of Germany ....... 4018399

[51] Int. Cl.$^5$ .............................................. C23C 14/34
[52] U.S. Cl. .......................... 204/192.27; 204/192.15; 204/192.28
[58] Field of Search ............... 204/192.14, 192.15, 204/192.26, 192.27, 192.28

[56] References Cited

U.S. PATENT DOCUMENTS

| | | | |
|---|---|---|---|
| 4,322,276 | 3/1982 | Meckel et al. | 204/192.26 |
| 4,331,526 | 5/1982 | Kuehnle | 204/192.26 X |
| 4,413,877 | 11/1983 | Suzuki et al. | 204/192.26 X |
| 4,462,883 | 7/1984 | Hart | 204/192.26 |
| 4,534,841 | 8/1985 | Hartig et al. | 204/192.26 |
| 4,891,113 | 1/1990 | Criss | 204/192.26 X |
| 5,096,776 | 3/1992 | Gillery | 204/192.27 X |

FOREIGN PATENT DOCUMENTS

| | | |
|---|---|---|
| 0041463 | 1/1984 | European Pat. Off. . |
| 0279550 | 8/1988 | European Pat. Off. . |
| 0281048 | 9/1988 | European Pat. Off. . |
| 0332177 | 9/1989 | European Pat. Off. . |
| 2122258 | 11/1971 | Fed. Rep. of Germany . |
| 7729963 | 2/1978 | Fed. Rep. of Germany . |
| 3610486 | 10/1986 | Fed. Rep. of Germany . |
| 3742204 | 6/1989 | Fed. Rep. of Germany . |
| 636655 | 6/1983 | Switzerland . |

*Primary Examiner*—Nam Nguyen
*Attorney, Agent, or Firm*—Hill, Steadman & Simpson

[57] ABSTRACT

A transparent substrate, such as glass, having a solar control coating consisting of a CrN layer between two SnO, layers. The solar control coating is arranged on the back side of the substrate which will face away from an observer when in place. A sub-oxidic alloy, such as NiCrO is then applied to the solar control coating.

12 Claims, 1 Drawing Sheet

METHOD FOR PRODUCING AN OPAQUE SUBSTRATE

BACKGROUND OF THE INVENTION

The present invention relates to a method for coating a substrate, such as a glass pane, to achieve an opaque effect.

Specifically, the invention provides a method for manufacturing a layer that has an opaque effect on a substrate, such as a glass pane, whereby the substrate is provided with a layer system, or with a layer, that has prescribed reflective properties to solar radiation and prescribed transmission properties in the visible solar range, i.e., a solar control coating.

The present invention also relates to an opaque coated substrate, such as a glass pane, having both a solar control coating and a layer of an opacifier, or opacifying layer.

A method for manufacturing substrates, wherein transparent substrates are coated with a solar control coating via cathode sputtering, is disclosed in German Published Application 3,311,815. Substrates manufactured by this method have a transmissibility of 10 to 40%, although preferably 15 to 30%, and further have a reflectivity capable of reflecting incident solar radiation.

The published application proposes that an oxide layer, having an optical thickness ranging from 20 to 280 nm, be sputtered directly onto a substrate in an oxygenated atmosphere. A second layer of chromium-nitride, having a geometrical thickness ranging from 10 to 30 nm, is sputtered onto the substrate in an atmosphere composed of inert gas and nitrogen. The above-identified patent application describes one of the many examples of solar control coatings.

Such solar control coatings are useful, for example, in the coating of architectural glass for building construction. As the needs for reflectivity and transmissibility of transparent substrates vary with climatic conditions, it is desirable to have a defined reflectivity and transmissibility when applying solar control coatings to materials, such as architectural glass.

For instance, depending on the intensity of the solar radiation, the solar control coating can have a heat insulating affect on transparent surfaces, such as architectural glass on a building. This heat insulating capability is intended to keep the interior of the building cool The transmission properties of the solar control coating can be adapted to different climates, or to different intensities of solar radiation. For instance, there are many known solar control coatings which have a number of individual layers that form a layer system. Each layer system can have a prescribed transmissibility. Thus, where solar intensity is greater, a lower transmissibility is required to insulate a structure, such as a building.

For example, in a building wall composed of architectural glass, such as an office skyscraper having numerous windows, it is desirable to achieve an overall visually uniform effect, even though the glass covers both window and non-window regions, the non-window regions can include masonry regions or cement walls. It is difficult to find a uniform glazing that can be used to coat the architectural glass in both the window and non-window regions, such that an observer on the exterior of the building cannot readily differentiate between the window and non-window regions of the architectural glass.

The reflectivity of the non-window regions should be comparable to that of the window regions. The transmissibility, however, must be extremely low in the non-window regions, such that an observer cannot see the masonry or cement behind the glass, as compared to the windows regions, where the transmissibility can be much greater.

In order to achieve an overall visually uniform effect across the surface of a transparent substrate, such as a building wall, gluing a foil or spraying a paint onto the glazing has been proposed.

These and other known coating methods are involved and expensive, and do not meet modern needs for achieving an overall visually uniform effect of a surface treated with a solar control coating.

SUMMARY OF THE INVENTION

The present invention provides a method for applying layers to a transparent substrate, which has an overall visually uniform effect. For example, when the invention is applied to non-window and window regions of architectural glass, the non-window regions have the same reflectivity and color coordinate system values as the window regions, but the non-window regions have extremely low transmission values as compared to the window regions.

The invention should make it possible to produce, for example, a black, absorbent, weather-resistant coating on a glass pane. When such a glass pane is glued to a building wall, the chemical properties of the coating should not change when the coating is brought into contact with an adhesive.

Further, the present invention provides an optically superior coating that is both more corrosion-resistant and cost-efficient than currently available coatings.

To this end, the present invention relates to a method for manufacturing a coating layer, having an opaque effect on transparent substrates, such as a glass pane. The substrate is provided with a solar control coating, either a layer system or a single layer, and having a prescribed reflectivity, that reflects incident solar radiation, and a prescribed transmissibility, for the transmission of wavelengths within the visible spectrum. The solar control coating is applied, followed by an opaque layer, resulting in an opaque substrate. The opaque layer is produced by sputtering a sub-oxidic alloy Ni-$CrO_X$ onto the substrate. The opaque layer can be sputtered with the same equipment used to sputter the solar coated coating onto the substrate.

The present invention also relates to a coated substrate, such as a glass pane, to which a solar control coating and an opaque layer are applied. It is proposed that the opaque layer is composed of sub-oxidic Ni-$CrO_X$.

In a preferred embodiment, the opacifying layer is applied by a sputtering process onto a transparent substrate.

In a preferred embodiment, the opacifying layer can be applied by sputtering a sub-oxidic alloy, such as NiCr$O_X$, to the combined substrate and solar control coating, or layer system.

In another embodiment, the opacifying layer and the layer system can be sputtered onto the transparent substrate using the same system.

In an embodiment, the solar control coating is applied by sputtering a layer system, having one or a number of layers, onto the substrate. Sputtering of the solar control coating and a suboxidic alloy onto the substrate can be performed in the same sputtering system. In an embodiment, the sub-oxidic alloy is sputtered using a sputtering process in a further cathode station.

In an embodiment, the opaque affect can be inventively achieved by sputtering a sub-oxidic alloy, NiCrO$_x$, containing 65 to 85 atomic percent Ni and 35 to 15 atomic percent Cr onto the substrate.

In an embodiment, the sub-oxidic alloy NiCrO$_x$ contains 70 to 80 atomic percent Ni and 30 to 20 atomic percent Cr.

In an embodiment, the proportion of Ni to Cr is 80 atomic percent Ni to 20 atomic percent Cr, or 70 atomic percent Ni to 30 atomic percent Cr.

In an embodiment, sputtering is undertaken from a NiCr target in a Ar-O$_2$, gas mixture at a pressure of $1 \times 10^{-2}$ to $2 \times 10^{-3}$ mbar.

In a preferred embodiment, the Ar-O$_2$, gas mixture is at a pressure of $4 \times 10$ mbar.

In an embodiment, the transparent substrate is chosen from the group consisting of glass, float glass, mineral glass, plastic, plastic foil, and plastic sheets or panels.

Further, the invention relates to a transparent substrate, such as glass, which is provided with a layer, or a plurality of layers, having a predetermined reflectivity and transmissibility, and being provided with an opacifying layer to achieve an opaque effect.

In an embodiment, the opacifying layer is composed of a suboxidic alloy.

In an embodiment, the opacifying layer is composed of a suboxidic NiCrO$_x$ layer.

In an embodiment, the opacifying layer has a thickness above 1200Å, and preferably from 1500 to 2000Å.

In a preferred embodiment, the opacifying layer has thickness of 2000Å.

In an embodiment, the opacifying layer can be sputtered onto a solar control coating that comprises a metal layer, a metal oxide layer or a metal nitride layer.

In an embodiment, the solar control coating sputter-coated with the sub-oxidic alloy NiCrO$_x$ comprises a layer system including a metal oxide layer adjoining a substrate, preferably a glass substrate, a metal layer adjoining the metal oxide layer, and another metal oxide layer adjoining the metal layer.

In an embodiment, the solar control coating sputter-coated with the sub-oxidic alloy NiCrO$_x$ comprises a layer system including a metal oxide layer adjoining a substrate, preferably a glass substrate, a metal nitride layer adjoining the metal oxide layer, and another metal oxide layer adjoining the metal nitride layer.

In an embodiment, the solar control coating sputter-coated with the sub-oxidic alloy NiCrO$_x$ comprises a layer system including a metal layer adjoining a substrate, preferably a glass substrate, and a metal oxide layer adjoining the metal layer. Alternatively, the layer system includes a metal nitride layer adjoining a substrate, preferably a glass substrate, and a metal oxide layer adjoining the metal nitride layer.

In an embodiment, the solar control coating sputter-coated with a sub-oxidic alloy NiCrO$_x$ comprises a layer system including a metal layer adjoining the substrate. Alternatively, the layer system includes a metal nitride layer adjoining the substrate.

In an embodiment, the coated substrate can include a solar control coating, sputter-coated with the sub-oxidic alloy NiCrO$_x$, and resulting in a layer system having individual layers comprising materials including metals, metal oxides, and metal nitrites.

In an embodiment, the solar control coating includes a first SnO$_2$, oxide layer adjoining the substrate, a second CrN layer, and a third SnO$_2$ layer, arranged on a side of the substrate so as to be mounted facing away from the observer.

An advantage of the invention is that, for example, a black coating which is absorbent, weather-resistant, and non-reactive to adhesive, can be produced.

Further, an economical, corrosive-resistant, and optically superior coating can be achieved with the invention.

An additional advantage of the invention is that the opacifying layer can be sputtered by the same system in which the solar control coating is sputtered onto the substrate. Thus, it is not necessary to change systems.

The invention provides for a manufacture of more cost-effective substrates.

Additional features and advantages of the present invention are described in, and will be apparent from, the detailed description of the presently preferred embodiments and from the drawing.

DETAILED DESCRIPTION OF THE PRESENTLY PREFERRED EMBODIMENTS

Figure 1:
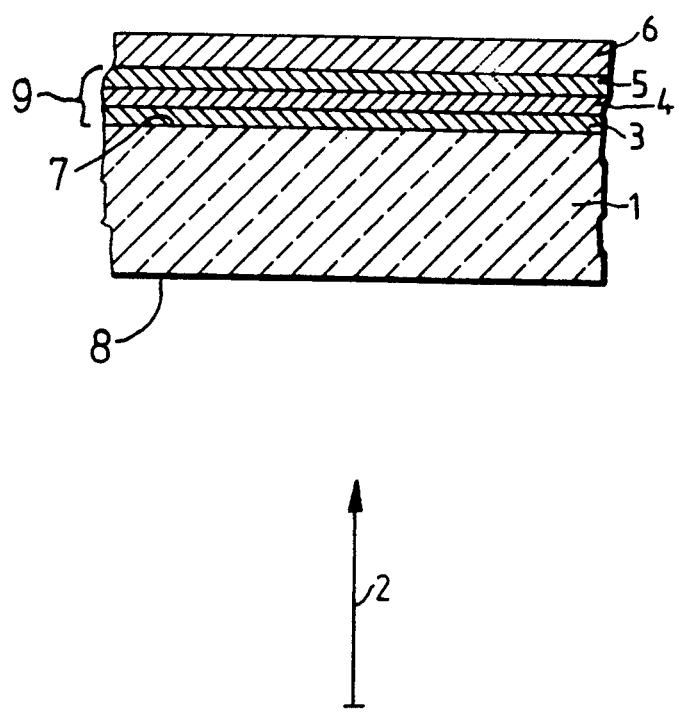
FIG. 1 illustrates a sectional view of a transparent substrate having a solar control layer system and layer of an opacifier pursuant to the present invention.

A substrate 1, such as a glass pane, is illustrated in FIG. 1. Of course, other transparent substrates can be used such as plastic, plastic foil, plexiglass in panels, plastic sheets, mineral glass, float glass, and other glasses. The substrate 1 includes a back side 7. The back side 7 can be the outer surface, a second face, or an enclosing surface. The substrate also includes a front side 8. The front side 8 can be the inner surface, a first face, or an observing surface.

To provide a solar control coating for the substrate 1, in the illustrated embodiment, a combination of a SnO$_2$ layer 3 arranged on a back side 7 of the substrate 1, followed by a CrN layer 4 disposed between the SnO$_2$ layer 3 and a further SnO$_2$ layer 5 is provided. The solar control coating 9 is thereby composed of three layers 3, 4 and 5, and is preferably applied to the back side 7 of the transparent substance (with reference to the viewing direction indicated by 2).

An opacifier layer 6 is applied to the solar control coating 9. In an embodiment of the invention, the opacifier layer 6 is a sub-oxidic NiCrO$_x$ alloy that can be sputtered onto the solar control coating 9 from a NiCr target. The opacifier layer 6, if desired, can be applied in a further cathode station. In an embodiment, the target contains 65 to 85 atomic percent nickel and 35 to 15 atomic percent chromium. The mixture is sputtered into a gas atmosphere composed or Ar and O$_2$, for example, at a pressure of $4 \times 10^{-2}$ mbar. Preferably, the pressure is between $1 \times 10^{-2}$ to $2 \times 10^{-3}$ mbar. The opacifier layer has a thickness of from approximately 1200 to about 2000Å and most preferably 1500 to about 2000Å. A thickness of 2000Å has been found to be especially advantageous.

Pursuant to the present invention, the sputtering can be carried out with sub-oxidic NiCrO$_x$ wherein the proportion of Ni is 70 to 80 atomic percent and the proportion of Cr is 30 to 20 atomic percent.

It has been found to be especially advantageous if the proportion of Ni is 80 atomic percent and the proportion of Cr is 20 atomic percent or the proportion of Ni is 70 atomic percent and the proportion of Cr is 30 atomic percent.

It has been found that such an opacifying layer will transmit less than 1% of incident solar radiation. The reflectivity of a transparent substrate provided with a solar control coating and an additional layer of an opacifier is substantially the same as the reflectivity of a transparent substrate provided with a solar control coating alone. For example, the transparent substrate can be an architectural glass, used in constructing buildings, and a solar control coating and opacifying layer can be applied in accordance with the principles of the present invention to the glass designated for non-window regions. The same solar control coating can be applied to the glass designated for window regions, where the layer of opacifier is omitted.

A building so constructed has a substantially uniform reflectivity and a varied transmissibility. Accordingly, one viewing the building will not see the structural regions of the building behind the non-window region glass when the non-window regions are manufactured pursuant to the method of the present invention.

The present invention can be utilized in a variety of structures. The opacifier layer can be sputtered onto a solar control coating that comprises a metal layer, a metal oxide layer, or a metal nitride layer.

As set forth in Tables 1 and 2 below, the color coordinate values are substantially similar in the designated window and non-window regions. Tables 1 and 2 list various types of glasses having solar control coatings. The various glass types have different transmission values $T_L$ due to different solar control coatings.

Values for the percentage of light transmission, $T_L$, in the visible spectrum, light reflection, $R_L$, in the visible spectrum and for color coordinate values a* and b* for the reflected light of the front side 8 of FIG. 1 are disclosed in Table 1 below for a variety of substrates.

Table 1 contains the transmissibility and reflectivity, as well as the color coordinate values, for various types of glass. Table 2 contains the values for the reflectivity as well as the color coordinate values, for the various types of glass having an opacifier in addition to a solar control coating.

TABLE 1

| Type | Glass Types Without Opacifier | | | |
|------|------|------|------|------|
|      | $T_L$ %; | $R_L$ %; | a*; | b*; |
| CB-14 | 14 | 21 | −1.79 | 8.9 |
| CB-35 | 35 | 7.9 | −0.5 | 4.5 |
| CB-11 | 11 | 42 | −2.7 | −1.0 |
| CR-14 | 14 | 26.1 | −1.54 | 2.05 |
| CR-14 | 14 | 19.8 | −2.5 | −13.5 |
| CB-35 | 35 | 8.3 | −0.45 | 3.6 |

TABLE 2

| Type | Glass Types With Opacifier | | |
|------|------|------|------|
|      | $R_L$ %; | a*; | b*; |
| CB-14 | 21.5 | −1.76 | 7.4 |
| CB-35 | 9.2 | −0.9 | 5.0 |
| CB-11 | 41.0 | −3.0 | 0.4 |
| CR-14 | 27.9 | −1.30 | 1.34 |
| CR-14 | 19.4 | −1.7 | −14.5 |
| CB-35 | 7.6 | +0.45 | 3.4 |

Designations of the types of glass having solar control coatings are listed in the left-hand columns of Tables 1 and 2. The various glass types have different transmission values $T_L$ for different solar control coatings.

In all types that were provided with opacifier, the transmission ($T_L$%) in the visible range of the light was below 1%.

As demonstrated in Tables 1 and 2, the reflection and color coordinate values for glass types having an opacifying layer vary only slightly from the reflection and color coordinate values for glass types not having an opacifying layer. An optically uniform effect is thus guaranteed.

Additionally, the transmission values of the glass provided with an opacifier lie below 1%. Thus, an observer viewing, for example, architectural glass, sputter-coated with the opacifier, on a building, will be substantially prevented from seeing the building structure behind the glass treated with the opacifying layer.

Pursuant to the present invention, an overall uniform color impression is also achieved. The glass with a layer of opacifier has substantially the same values with respect to the color coordinate system as the glass without an layer of opacifier.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for coating a transparent substrate to achieve an opaque effect, comprising the step of:
    sputtering a sub-oxidic alloy NiCrO$_X$ layer that creates an opaque effect onto a substrate.

2. The method of claim 1, further comprising the step of sputtering a solar control coating onto the substrate with the sub-oxidic alloy NiCrO$_X$.

3. The method of claim 2 wherein sputtering a solar control coating is performed using a first cathode station and sputtering a sub-oxidic alloy NiCrO$_X$ is performed by a sputtering process in a further cathode station, both cathode stations being present in one sputtering system.

4. The method of claim 1, including the step of applying a solar control coating by a sputtering process, both the solar control coating and suboxidic alloy NiCrO$_X$ being applied using the same sputtering system.

5. The method of claim 1, wherein the proportion of Ni amounts to 65 to 85 atomic percent and the proportion of Cr amounts to 35 to 15 atomic percent.

6. The method of claim 1, wherein the proportion of Ni amounts to 70 to 80 atomic percent and the proportion of Cr is 30 to 20 atomic percent.

7. The method of claim 1, wherein the proportion of Ni is 80 atomic percent and the proportion of Cr is 20 atomic percent.

8. The method of claim 1, wherein the proportion of Ni is 70 atomic percent and the proportion of Cr is 30 atomic percent.

9. A method for coating a substrate to achieve an opaque effect, including the steps of:
    a) applying at least one layer of a solar control coating onto said substrate, said solar control coating having a prescribed reflectivity and transmissibility, and b) sputtering an opacifier layer to said solar control coating, wherein said opacifier layer includes a sub-oxidic alloy $NiCrO_x$.

10. The method of claim 9, wherein the $NiCrO_x$ alloy includes 65 to 85 atomic percent Ni and 35 to 15 atomic percent Cr.

11. The method of claim 9, wherein the $NiCrO_x$ alloy includes 80 atomic percent Ni and 20 atomic percent Cr.

12. The method of claim 9, wherein the $NiCrO_x$ alloy includes 70 atomic percent Ni and 30 atomic percent Cr by weight.

* * * * *